(12) United States Patent
Kahan

(10) Patent No.: US 8,130,981 B2
(45) Date of Patent: Mar. 6, 2012

(54) SOUND CARD HAVING FEEDBACK CALIBRATION LOOP

(75) Inventor: Joseph M. Kahan, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 834 days.

(21) Appl. No.: 12/054,494

(22) Filed: Mar. 25, 2008

(65) Prior Publication Data

US 2008/0165990 A1 Jul. 10, 2008

Related U.S. Application Data

(63) Continuation of application No. 10/947,086, filed on Sep. 22, 2004, now abandoned.

(51) Int. Cl.
*H03F 99/00* (2009.01)
(52) U.S. Cl. ........... 381/120; 381/121; 381/104; 700/94
(58) Field of Classification Search ............ 381/56–59, 381/104–109, 318, 321, 120, 121; 700/94; 330/2; 324/600–726, 73.1; 704/225; 379/390.01–390.04
See application file for complete search history.

(56) References Cited

U.S. PATENT DOCUMENTS

| | | | |
|---|---|---|---|
| 3,702,970 A * | 11/1972 | Stetzler | 330/2 |
| 5,239,693 A * | 8/1993 | Gailus et al. | 455/115.2 |
| 5,748,038 A * | 5/1998 | Boscovic et al. | 330/2 |
| 5,752,224 A | 5/1998 | Tsutsui et al. | |
| 5,899,969 A | 5/1999 | Fielder et al. | |
| 5,974,379 A | 10/1999 | Hatanaka et al. | |
| 6,112,170 A | 8/2000 | Patwardhan et al. | |
| 6,272,465 B1 | 8/2001 | Hewitt et al. | |
| 6,351,733 B1 | 2/2002 | Saunders et al. | |
| 6,405,164 B1 | 6/2002 | Pinai | |
| 6,687,663 B1 | 2/2004 | McGrath et al. | |
| 2002/0067835 A1* | 6/2002 | Vatter | 381/58 |
| 2003/0091180 A1* | 5/2003 | Sorqvist et al. | 379/390.03 |
| 2004/0029637 A1 | 2/2004 | Hein, Jr. et al. | |

* cited by examiner

*Primary Examiner* — Vivian Chin
*Assistant Examiner* — Fatimat O Olaniran
(74) *Attorney, Agent, or Firm* — Gibb I.P. Law Firm, LLC; Derek S. Jennings

(57) ABSTRACT

Disclosed are a sound card and a method for limiting inputs to and outputs from that computer sound card. Specifically, the voltage of a feedback connection between the input and output of a sound card amplifier is increased from minimum voltage until an over-saturation condition occurs. This finds the "output voltage limit." Thereafter, the output voltage of the amplifier is restricted to the output voltage limit. The feedback connection is then terminated and the voltage of the signal being supplied to the amplifier is increased from minimum voltage until the over-saturation condition again occurs. This finds the "input voltage limit." Thereafter, the input supplied to the amplifier is restricted to the input voltage limit.

27 Claims, 4 Drawing Sheets

SOUND CARD HAVING FEEDBACK CALIBRATION LOOP

CROSS-REFERENCE TO RELATED APPLICATIONS

This application is a Continuation of U.S. application Ser. No. 10/947,086 filed Sep. 22, 2004, the complete disclosure of which, in its entirety, is herein incorporated by reference.

BACKGROUND OF THE INVENTION

1. Field of the Invention

This disclosure presents a method of limiting inputs to, and outputs from, a computer sound card, and presents a novel sound card.

2. Description of the Related Art

Sound cards are very useful devices generally used within computerized devices, such as computers, video games, entertainment devices, etc. However, there is often noise and other drawbacks that prevent the sound card from operating optimally. The invention described below addresses the issue of noise associated with the sound card and external devices connected to the sound card.

SUMMARY OF THE INVENTION

This disclosure presents a method of limiting inputs to, and outputs from, a computer sound card. With this method, the output of a sound card amplifier is connected to the input of the amplifier using a feedback connection. The method adjusts the output voltage of the amplifier to maximum voltage and supplies a signal to the amplifier. Then, the invention increases the voltage of the feedback connection from minimum voltage until an over-saturation condition occurs. The "over-saturation condition" occurs where harmonics of the signal's frequency (e.g., noise) begin being output from the amplifier. Next, the invention slightly decreases the voltage of the feedback connection until the harmonics just stop being output from the amplifier. This voltage is recorded as the "output voltage limit." Thereafter, the output voltage of the amplifier is restricted to the output voltage limit. The feedback connection is then terminated and the voltage of the signal being supplied to the amplifier is increased from minimum voltage until the over-saturation condition again occurs. Again, the voltage of the signal is decreased until the harmonics just stop being output from the amplifier. This voltage is recorded as the "input voltage limit." Thereafter, the input supplied to the amplifier is restricted to the input voltage limit. A different frequency signal than is used to find the input voltage limit, can be used to find the output voltage limit. Generally, the output voltage limit is higher than input voltage limit.

The invention tunes an audio computer sound card to ensure the best quality audio processing for compression or general digital recording. The invention establishes voltage thresholds for the audio card to provide the best possible output signal. The invention finds and controls the cards, unique saturation thresholds. Finding the input saturation point and the output saturation point of the sound card port provides the upper and lower limits to ensure the best quality encoded signal. By staying close to and under the input saturation point, the sound card will add minimal noise to the original signal. The same goes for not exceeding the output saturation point of the sound card. Combining both pieces of information allows the invention to easily stay within the limits of the sound card.

The invention can also repeat this methodology to find the output voltage limit and the input voltage limit with the signal set at different frequency steps. After recording the various output voltage limits and input voltage limits for these different frequency steps, the invention can then adjust the limit on voltage being input to and output from the amplifier depending upon the frequency range of signals being input to the sound card. The method can also be repeated whenever environmental condition that may affect the sound card's performance change. Therefore, the process can be repeated periodically or when the temperature of the sound card changes more than a predetermined temperature change limit, as well as when other similar changes occur.

The sound card is used to process audio signals during operational periods, and this methodology is performed during non-operational periods (e.g., calibration periods) when audio signals are not being processed. Thus, the feedback connection is used only when finding the output voltage limit and not during the operational periods. This method maintains the output voltage of the amplifier as close as possible to the output voltage limit by adjusting either the amplifier or an input voltage controller.

The inventive sound card used with the inventive methodology comprises at least one amplifier connected to the input and output of the sound card. At least one feedback loop is connected to the amplifier input and output and a feedback controller is positioned within the feedback loop. At least one input voltage controller is connected between the sound card input and the amplifier input.

In addition, at least one sound card controller is connected to the input voltage controller, the amplifier, and the feedback voltage controller. The sound card controller is adapted to measure the voltage output limit using the feedback loop, and measure the voltage input limit of the amplifier. The feedback loop is activated only when measuring the voltage output limit. Further, the sound card controller limits the voltage of signals output by the amplifier to the voltage output limit (maximum) and limits input voltages processed through the input voltage controller to the voltage input limit (maximum).

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION

Figure 1:
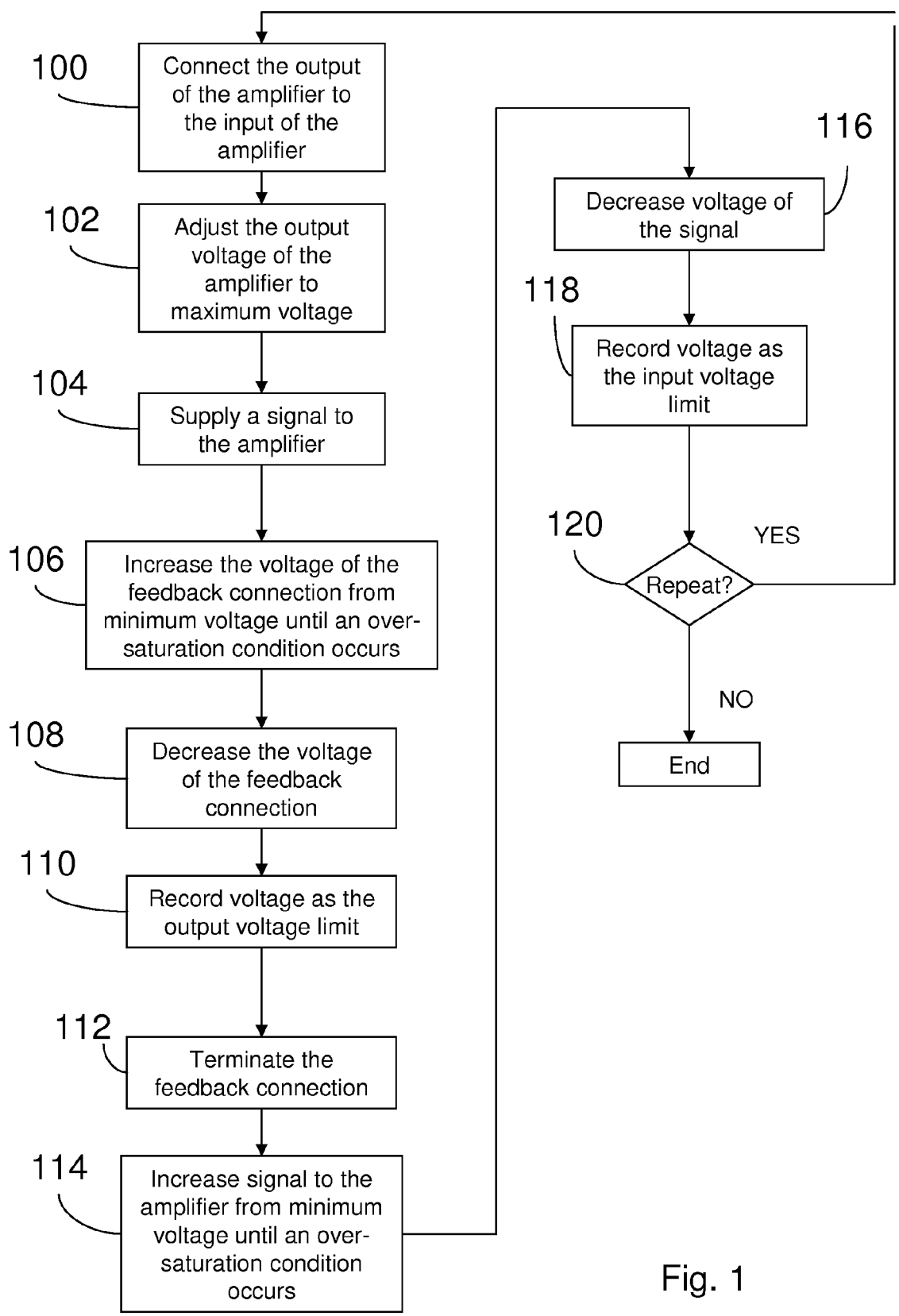
FIG. 1 is a flow diagram illustrating an embodiment of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

This disclosure presents a method of limiting inputs to and outputs from a computer sound card and is shown in flowchart form in FIG. 1. In item 100, the output of a sound card amplifier is connected to the input of the amplifier using a feedback connection. The method then adjusts the output voltage of the amplifier to maximum voltage (item 102) and supplies a signal to the amplifier in item 104. Then, in item 106 the invention increases the voltage of the feedback connection from minimum voltage until an over-saturation condition occurs. The "over-saturation condition" occurs where harmonics of the signal's frequency (e.g., noise) begin being output from the amplifier. Next, the invention slightly decreases the voltage of the feedback connection until the harmonics just stop being output from the amplifier (item 108). This voltage is recorded as the "output voltage limit" in item 110. The output voltage limit is an upper limit or maximum and, thus, the output voltage of the amplifier is restricted to be equal to or less than the output voltage limit.

The feedback connection is then terminated in item 112 and the voltage of the signal being supplied to the amplifier is increased from minimum voltage until the over-saturation condition again occurs (item 114). Similarly, the voltage of the signal is decreased until the harmonics just stop being output from the amplifier in item 116. This voltage is recorded as the "input voltage limit" in item 118. The output voltage limit is an upper limit or maximum and, thus, the output voltage of the amplifier is restricted to be equal to or less than the output voltage limit.

A different frequency signal than is used to find the input voltage limit, can be used to find the output voltage limit. Generally, the output voltage limit is higher than the input voltage limit. For example, the input signal saturation point could be 200 mV and the output saturation point could be 600 mV. In this example, the invention would connect the feedback loop and find the 600 mV output saturation point (voltage limit) as described above. Then, the feedback loop would be disconnected and the output of the amplifier would be limited to 600 mV. Next, the input saturation point (voltage limit) of 200 mV would be found as described above, with the amplifier limited to 600 mV. This process tunes or calibrates the sound card. Once the sound card is properly tuned, all input signals are limited to 200 mV and the output signals are limited to 600 mV. Therefore, if an input signal is received that is above 200 mV, the invention uses an input voltage controller to decrease the voltage to 200 mV. Conversely, if the input signal is below 200 mV, the input voltage controller is used to increase the voltage up to 200 mV. Similarly, if the output of the amplifier is above 600 mV, the invention reduces the amplification so that the output voltage is 600 mV or below. Also, if the output of the amplifier is below 600 mV, the invention increases the output of the amplifier up to approximately 600 mV. By not exceeding 200 mV on the input signal, the sound card controller can adjust the output signal of the amplifier up to 600 mV without worrying about adding too much noise harmonics to the original signal for encoding.

The invention can also repeat this methodology to find the output voltage limit and the input voltage limit with the signal set at different frequency steps. The automated tuning function can perform a test of several different sound tones to best ensure that all input saturation points are below any distortion levels that would corrupt the resulting digital output. For example, a stair step test could be performed ranging from 20 Hz to 20,000 Hz in increments of 500 Hz in order to verify levels.

Thus, in decision box 120, if a repeat is to be performed because additional frequency steps are remaining to be evaluated, processing loops back to item 100 to determine the input and output voltage limits for the next frequency step. After recording the various output voltage limits and input voltage limits for these different frequency steps, the invention can then adjust the limit on voltage being input to and output from the amplifier depending upon the frequency range of signals being input to the sound card. Alternatively, an algorithm can be applied to the input and output voltage limits for the different frequency steps. Thus, for example, the invention can find the mean, median, standard deviation, etc. of the various input and output voltage limits and use these one or more of these statistical values to control all signals being supplied to the sound card.

In item 120, the methodology can also be repeated whenever environmental condition that may affect the sound card's performance change. Therefore, the process can be repeated periodically, or when the temperature of the sound card changes more than a predetermined temperature change limit, as well as when other similar changes occur.

The sound card is used to process (record, encode, play, transmit, etc.) audio signals during normal operational periods, and this methodology is performed during non-operational periods (e.g., calibration periods) when audio signals are not being processed. Thus, the feedback connection is used only when finding the output voltage limit and not during the operational periods. This method maintains the output voltage of the amplifier as close as possible to the output voltage limit by adjusting either the amplifier or an input voltage controller. Both an automatic and a manual method can be used to initiate setting the limit or threshold setting for the sound card. That way if an individual wants to reset the card and check it again between sound captures, they can.

Figure 2:
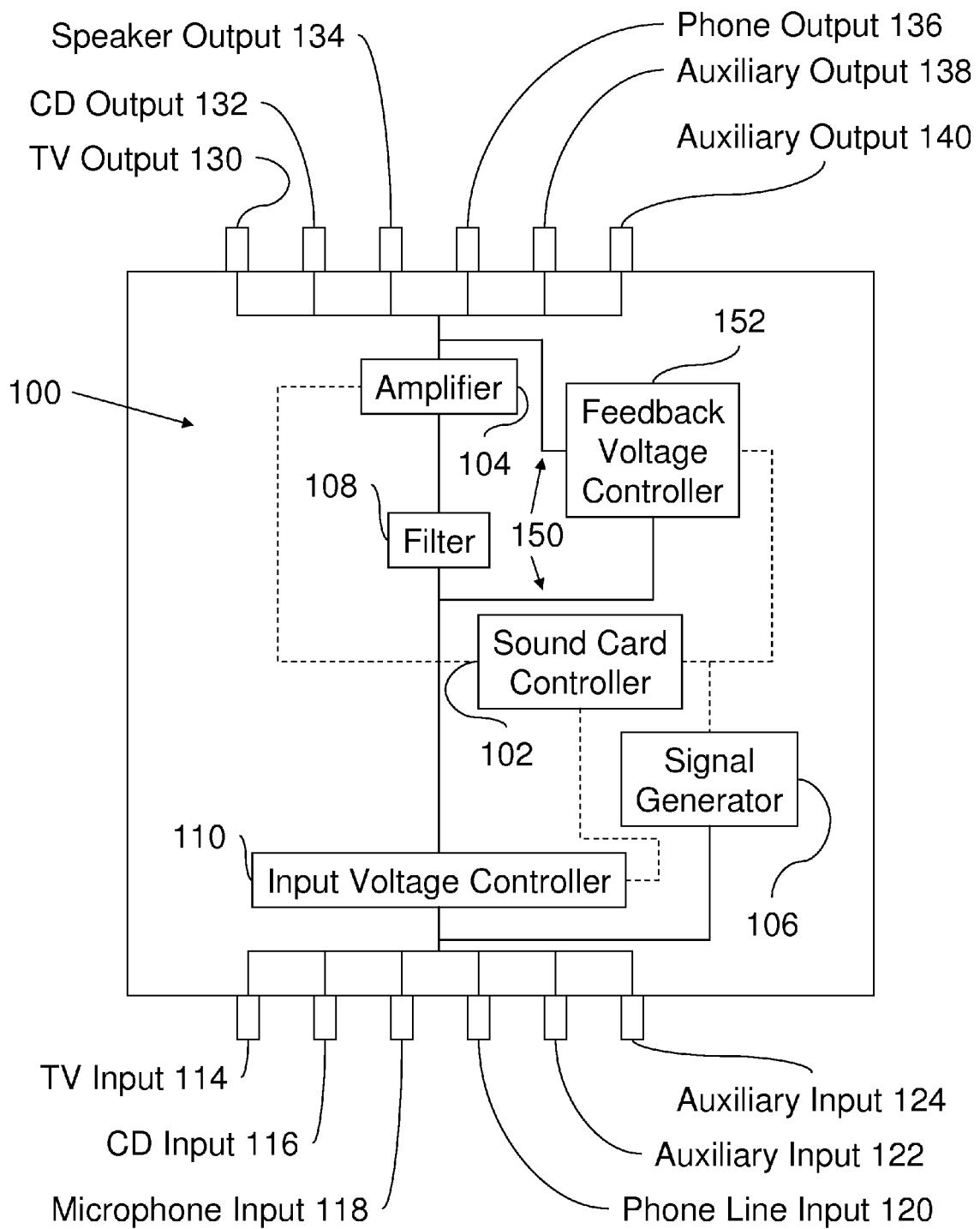
FIG. 2 is a schematic diagram of a sound card.
Figure 3:
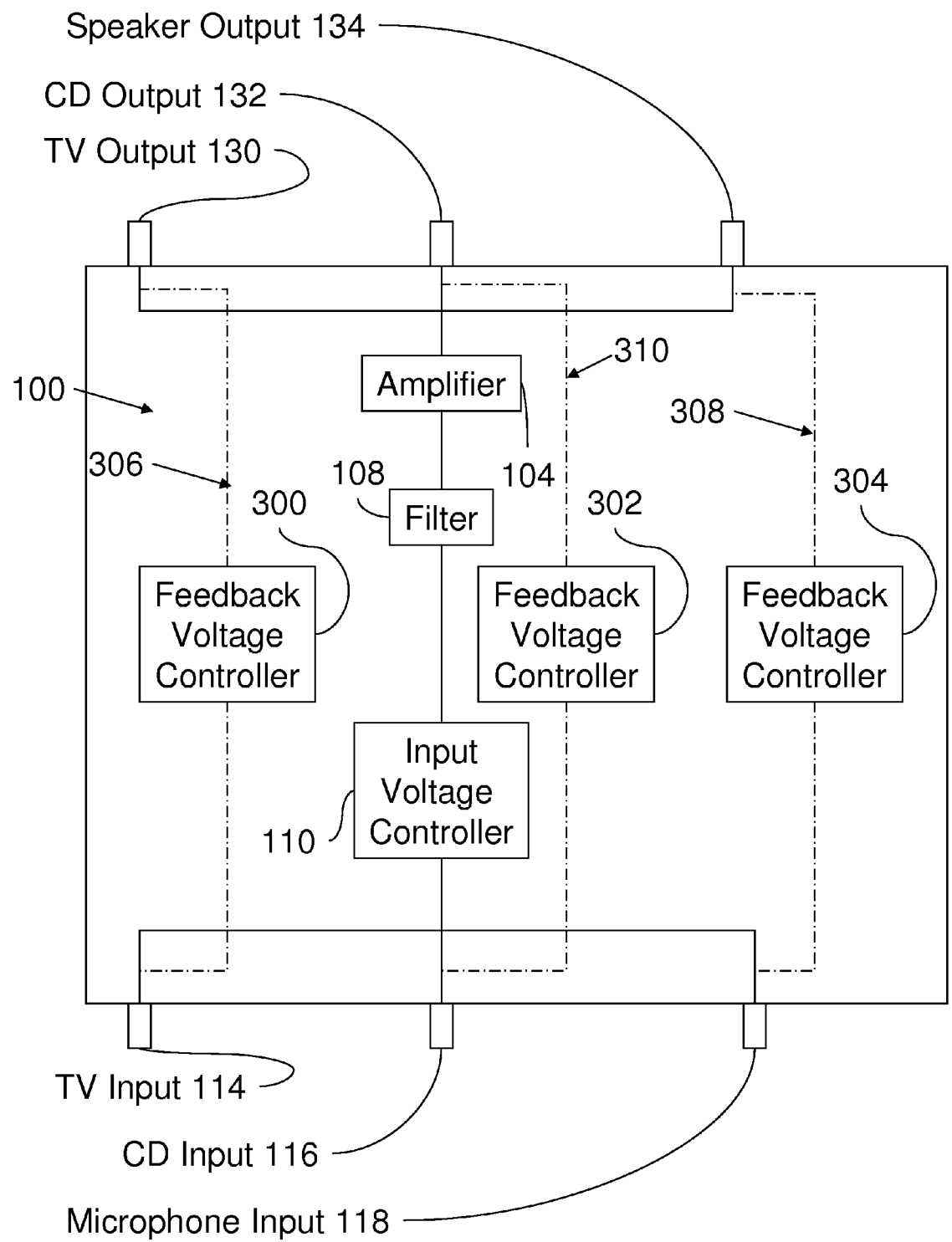
FIG. 3 is a schematic diagram of a sound card.
Figure 4:
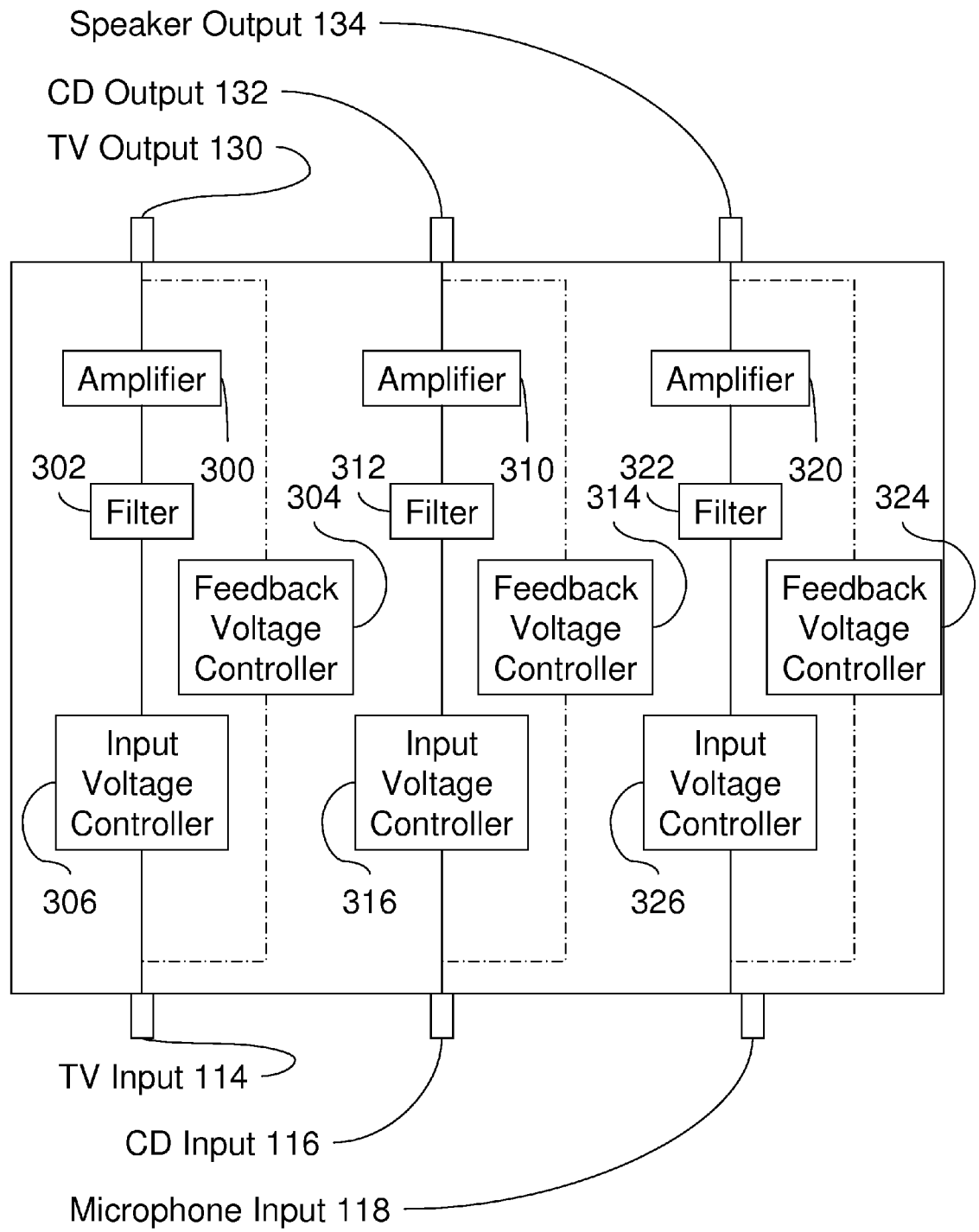
FIG. 4 is a schematic diagram of a sound card.

Non-limiting examples of the inventive sound card used with the inventive methodology are shown in FIGS. 2-4. As shown in FIG. 2, the sound card can include at least one filter 108, and at least one amplifier 104 connected to the inputs of the sound card 114-124 (such as a television (TV) input 114, a compact disc (CD) input 116, a microphone input 118, a phone line input 120, auxiliary inputs 122, 124, etc.) and outputs of the sound card 130-140 (such as a television (TV) output 130, a compact disc (CD) output 132, a speaker output 134, a phone line output 136, auxiliary outputs 138, 140, etc.). At least one feedback loop 150 is connected to the amplifier 104 input and output, and a feedback controller 152 is positioned within the feedback loop 150. At least one input voltage controller 110 is connected between the sound card inputs 114-124 and the amplifier 104 input. Many standard sound card features and structures that are unrelated to the invention have been omitted from the drawings and the discussion herein to focus on the salient features of the invention.

The feedback controller 152 and input voltage controller 110 comprise logic circuitry, resistors, transistors, amplifiers, etc. sufficient to vary the voltage on a signal line. Therefore, the feedback controller 152 has the ability to vary resistance to change the voltage on the feedback loop 150 and/or to break the electrical connection of the feedback loop 150 (effectively disconnecting the feedback loop 152 from the amplifier input and amplifier output). Similarly, the input voltage controller 110 includes the ability to vary the voltage of the signal being input from the sound card inputs 114-124.

In addition, at least one sound card controller 102 is connected to the input voltage controller 110, the amplifier 104, and the feedback voltage controller 152. The sound card controller 102 is adapted to measure the voltage output limit using the feedback loop 150, and measure the voltage input limit of the amplifier 104, using the processing shown in FIG. 1. For example, the sound card controller 102 includes a microprocessor, static and/or random memory, and logic circuitry sufficient to perform the processing shown in FIG. 1.

As mentioned above, the feedback loop 150 is activated only when measuring the voltage output limit. Further, the sound card controller 102 limits the voltage of signals output by the amplifier 104 to the voltage output limit (maximum) and limits input voltages processed through the input voltage controller 110 to the voltage input limit (maximum).

FIG. 3 illustrates an embodiment where the structure includes a plurality of feedback loops 306-310. Each feedback loop is connected to a respective pair of said sound card inputs and said sound card outputs (e.g., pair 114, 130; pair 116, 132; pair 118, 134). FIG. 4 illustrates a similar structure where each pair of inputs and outputs includes a dedicated amplifier (300, 310, 320), filter (302, 312, 322), feedback voltage controller (304, 314, 324), input voltage controller (306, 316, 326), etc.

Thus, as shown above, the invention tunes an audio computer sound card to ensure the best quality audio processing for compression or general digital recording. The invention establishes voltage thresholds for the audio card to provide the best possible output signal. The invention finds and controls the cards unique saturation thresholds. Finding the input saturation point and the output saturation point of the sound card port provides the upper and lower limits to ensure the best quality capturing. By staying close to and under the input saturation point, the sound card will add minimal noise to the original signal. The same goes for not exceeding the output saturation point of the sound card. Combining both pieces of information, allows the invention to easily keep the input device signal within the limits of the sound card.

The invention can be used, for example, to capture human voice from a microphone input or from a preamp, wherein each input would be pre-tested and set to the best operating condition with the invention. Each input device's unique input voltage would be examined and calibrated for the best operating setting, prior to doing any actual capturing. In this case, testing and setting the sound card would be done using a 300-3300 Hz range to accommodate the human voice. The result of setting the card to the proper operating range provides the highest level articulation of the human voice. This allows the user to compress the audio to much lower bandwidths, or provide an easier language translation, or assist users that are hearing impaired.

When using the invention for music capturing, case testing and setting the sound card could be done using a 20-20,000 Hz range for human hearing. The result of setting the card to the proper operating range provides the highest level digital recording of music. This allows the user to compress the audio to much lower bandwidths levels, Internet music sound bites, or Webcasting.

In post compression processing, it is important to understand that today music, videos and voice sound bites are transmitted via the Internet in almost all cases, in a compressed format. The problem with compressing audio is that is any noise is captured with the original audio signal and the compressed final version can be very bad. This invention helps to prevent additional noise prior to compression. Because part of the design of this invention is to provide the cleanest signal possible, the resulting post processed compressed signal is also of the highest quality possible. When capturing from unique inputs the voltages would be examined and calibrated for the best operating setting, prior to doing any actual capturing. The testing frequency range may vary depending on the type of compression to be used. The result of setting the card to the proper operating range again provides the highest level of re-recording or capturing of the sound. This allows the user to compress the audio to much lower bandwidths from the original signal such as MP3 or Webcasting.

Voice over IP telephone usage is one of the most vital emerging technologies to come about in the last decade is Voice over IP telephone calls. The problem with using this technology is that the compression of the audio is always designed for very low bandwidth levels which means the input signal from a microphone device must be very clean of distortion or when compression occurs, the resulting compressed output articulation will be bad. This invention helps to prevent any additional noise prior to compression. Because part of the design of this invention is to provide the cleanest signal possible, the resulting post processed compressed signal is also of the highest quality possible. In this case testing and setting the sound card would be done using a 300-3300 Hz range. The result of setting the card to the proper operating range again provides the highest level re-recording or capturing of the audio for transmission.

Video-conferencing usage is another emerging technology to come about in the last decade. Again, the problem with using this technology is that the compression of the audio is always designed for very low bandwidth levels which means the input signal from a microphone device must be very clean of distortion or when compression occurs, the resulting compressed output articulation will be bad. This process helps to prevent any additional noise prior to compression. Because part of the design of this invention is to provide the cleanest signal possible, the resulting post processed compressed signal is also of the highest quality possible.

While the invention has been described in terms of preferred embodiments, those skilled in the art will recognize that the invention can be practiced with modification within the spirit and scope of the appended claims.

What is claimed is:

1. A sound card comprising:
at least one amplifier having at least one amplifier input and at least one amplifier output;
at least one sound card input connected to said amplifier input;
at least one sound card output connected to said amplifier output;
at least one feedback loop connected to said amplifier input and said amplifier output;
a feedback controller in said feedback loop;
at least one input voltage controller connected between said sound card input and said amplifier input; and
at least one sound card controller connected to said input voltage controller, said amplifier, and said feedback controller,
said sound card controller adjusting an output voltage of said amplifier to maximum voltage and supplying a signal having a frequency to said amplifier,
said feedback controller increasing a voltage of said feedback loop, as said signal is supplied to said amplifier and said output voltage is at said maximum voltage, from minimum voltage until an over-saturation condition occurs, said over-saturation condition comprising a condition where harmonics of said signal begin being output from said amplifier, said feedback controller further decreasing said voltage of said feedback loop until said harmonics stop being output from said amplifier, and said sound card controller measuring said voltage of said feedback loop as an output voltage limit when said harmonics stop being output from said amplifier and subsequently restricting said output voltage of said amplifier to being no more than said output voltage limit.

2. The sound card in claim 1, said feedback controller disconnecting said feedback loop when said harmonics stop being output from said amplifier.

3. The sound card in claim 2, after said feedback loop is disconnected, said sound card controller further performing the following:

increasing voltage of said signal being supplied to said amplifier from minimum voltage until said over-saturation condition again occurs;

decreasing said voltage of said signal until said harmonics again stop being output from said amplifier; and recording said voltage of said signal, when said harmonics again stop being output from said amplifier, as an input voltage limit.

4. The sound card in claim 3, after said recording, said sound card controller further restricting said voltage of said signal supplied to said amplifier to no more than said input voltage limit.

5. The sound card in claim 1, said feedback controller activating said feedback loop only when said voltage output limit is to be measured.

6. The sound card in claim 1, said sound card controller adjusting limits on voltage being input to and output from said amplifier depending up a frequency range of signals being input to said sound card.

7. The sound card in claim 6, said sound card controller limiting input voltages processed through said input voltage controller to said voltage input limit.

8. A sound card comprising:

a plurality of amplifiers, each amplifier having at least one amplifier input and at least one amplifier output;

a plurality of sound card inputs connected to amplifier inputs;

a plurality of sound card outputs connected to amplifier outputs;

a plurality of feedback loops, each of feedback loop being associated with a given amplifier and connected to a respective pair of said sound card inputs and said sound card outputs for said amplifier ;

a plurality of feedback controllers, each feedback controller being in a given feedback loop;

a plurality of input voltage controllers, each input voltage controller being connected between a sound card input and an amplifier input; and at least one sound card controller connected to said input voltage controllers, said amplifiers, and said feedback controllers, said sound card controller adjusting an output voltage of said amplifiers to maximum voltage and supplying signals having a frequency to said amplifiers, said feedback controllers each increasing a voltage of said given feedback loop, as said signal is supplied to said given amplifier and said output voltage is at said maximum voltage, from minimum voltage until an over-saturation condition occurs, said over-saturation condition comprising a condition where harmonics of said signal begin being output from said given amplifier, said feedback controllers each further decreasing said voltage of said given feedback loop until said harmonics stop being output from said given amplifier, and said sound card controller measuring, for each given feedback loop, said voltage of said given feedback loop as an output voltage limit when said harmonics stop being output from said given amplifier and subsequently restricting said output voltage of said given amplifier to being no more than said output voltage limit.

9. The sound card in claim 8, said feedback controllers each disconnecting said given feedback loop when said harmonics stop being output from said given amplifier.

10. The sound card in claim 9, after said feedback loops are disconnected, said sound card controller further performing, for each amplifier, the following:

increasing voltage of said signal being supplied to said amplifier from minimum voltage until said over-saturation condition again occurs;

decreasing said voltage of said signal until said harmonics again stop being output from said amplifier; and recording said voltage of said signal, when said harmonics again stop being output from said amplifier, as an input voltage limit for said amplifier.

11. The sound card in claim 10, after said recording, said sound card controller further restricting said voltage of said signal supplied to said amplifier to no more than said input voltage limit.

12. The sound card in claim 8, said feedback controllers activating said feedback loops only when voltage output limits for said amplifiers are to be measured.

13. The sound card in claim 8, said sound card controller adjusting limits on voltage being input to and output from said amplifiers depending up a frequency range of signals being input to said sound card.

14. The sound card in claim 13, said sound card controller limiting input voltages processed through each input voltage controller to said voltage input limit for said given amplifier.

15. A method of limiting inputs to and outputs from a computer sound card, said method comprising:

connecting an output of a sound card amplifier to an input of said amplifier using a feedback connection;

adjusting an output voltage of said amplifier to maximum voltage;

supplying a signal having a frequency to said amplifier;

increasing voltage of said feedback connection from minimum voltage until an over-saturation condition, said over-saturation condition comprising a condition where harmonics of said frequency begin being output from said amplifier;

decreasing said voltage of said feedback connection until said harmonics stop being output from said amplifier and recording said voltage as an output voltage limit; and restricting said output voltage of said amplifier to said output voltage limit.

16. The method in claim 15, further comprising repeating said method to find said output voltage limit with a signal set at different frequency steps.

17. The method in claim 16, further comprising adjusting limits on voltage output from said amplifier depending upon a frequency range of signals being input to said sound card.

18. The method in claim 15, further comprising repeating said method at least one of:
   when a temperature of said sound card changes more than a predetermined temperature change limit; and
   periodically.

19. The method in claim 15, wherein said sound card is used to process audio signals during operational periods, and said method is performed during non- operational periods when audio signals are not being processed; and
   said feedback connection is used only when finding said output voltage limit and not during said operational periods.

20. The method in claim 15, further comprising maintaining output voltage of said amplifier as close as possible to said output voltage limit by adjusting one of said amplifier and an input voltage controller.

21. The method in claim 15, further comprising:
   disconnecting said feedback connection when said harmonics stop being output from said amplifier;
   after said feedback connection is disconnected, increasing voltage of said signal being supplied to said amplifier from minimum voltage until said over-saturation condition again occurs;
   decreasing said voltage of said signal until said harmonics again stop being output from said amplifier;
   recording said voltage of said signal, when said harmonics again stop being output from said amplifier, as an input voltage limit; and
   restricting said voltage of said signal supplied to said amplifier to no more than said input voltage limit.

22. A method of limiting inputs to and outputs from a computer sound card, said method comprising:
   connecting an output of a sound card amplifier to an input of said amplifier using a feedback connection;
   adjusting an output voltage of said amplifier to maximum voltage;
   supplying a signal having a frequency to said amplifier;
   increasing voltage of said feedback connection from minimum voltage until an over-saturation condition occurs where harmonics of said frequency begin being output from said amplifier;
   decreasing said voltage of said feedback connection until said harmonics stop being output from said amplifier and recording said voltage as an output voltage limit;
   disconnecting said feedback connection;
   restricting said output voltage of said amplifier to said output voltage limit;
   increasing voltage of said signal being supplied to said amplifier from minimum voltage until said over-saturation condition occurs;
   decreasing said voltage of said signal until said harmonics stop being output from said amplifier and recording said voltage as an input voltage limit;
   restricting input supplied to said amplifier to said input voltage limit;
   repeating said method to find said output voltage limit and said input voltage limit with said signal set at different frequency steps; and
   adjusting limits on voltage being input to and output from said amplifier depending upon a frequency range of signals being input to said sound card.

23. The method in claim 22, further comprising repeating said method at least one of:
   when a temperature of said sound card changes more than a predetermined temperature change limit; and
   periodically.

24. The method in claim 22, wherein said sound card is used to process audio signals during operational periods, and said method is performed during non-operational periods when audio signals are not being processed; and
   said feedback connection is used only when finding said output voltage limit and not during said operational periods.

25. The method in claim 22, further comprising maintaining output voltage of said amplifier as close as possible to said output voltage limit by adjusting one of said amplifier and an input voltage controller.

26. The method in claim 22, wherein a different frequency signal is used to find said output voltage limit than is used to find said input voltage limit.

27. The method in claim 22, wherein said output voltage limit is higher than input voltage limit.

\* \* \* \* \*